310-334 SR

XR 3,840,826

United States Patent [19] [11] 3,840,826
Toda et al. [45] Oct. 8, 1974

[54] VARIABLE DELAY DEVICES USING FERROELASTIC-FERROELECTRIC MATERIALS

[75] Inventors: Minoru Toda; Soitiro Tosima, both of Tokyo, Japan

[73] Assignee: RCA Corporation, New York, N.Y.

[22] Filed: Aug. 16, 1973

[21] Appl. No.: 388,959

[52] U.S. Cl. ................ 333/30 R, 310/8.3, 310/9.5, 310/9.8
[51] Int. Cl. ....... H03h 9/26, H03h 9/30, H01v 7/02
[58] Field of Search ......... 333/30, 30 M, 72; 310/8, 310/8.1, 8.3–8.7, 9.5–9.8

[56] References Cited

OTHER PUBLICATIONS

Hoechli–"Bistable Acoustic Delay Line" in IBM Technical Disclosure Bulletin, Vol. 15, No. 1, June 1972; p. 32.

*Primary Examiner*—James W. Lawrence
*Assistant Examiner*—Marvin Nussbaum
*Attorney, Agent, or Firm*—Edward J. Norton; Joseph D. Lazar; Donald E. Mahoney

[57] ABSTRACT

An electronically variable time-delay device, utilizing either surface-wave or longitudinal-wave acoustic signals, comprises a crystal of ferroelastic and ferroelectric material. The crystal includes at least two domains of opposite ferroelectric polarization separated by a domain wall. An input transducer generates an acoustic signal which is translated through the device and across the domain wall. The velocity of the acoustic signal is different for the different domains of polarization. The domain wall can be moved by applying an electric field along the *c*-axis of the crystal. Thus, the net delay provided by the device is controlled by changing the position of the domain wall.

14 Claims, 5 Drawing Figures

PATENTED OCT 8 1974 3,840,826

VARIABLE DELAY DEVICES USING FERROELASTIC-FERROELECTRIC MATERIALS

BACKGROUND OF THE INVENTION

This invention relates to variable delay devices utilizing acoustic signals and, more particularly, to such devices utilizing ferroelastic and ferroelectric crystals.

Variable-delay device are important in the field of signal processing technology. For example, these devices have been used for adjusting the time delay and/or phase adjustment of a radio frequency signal. More recently, there has been considerable interest in acoustic delay lines as these devices are much smaller in size than their electromagnetic counterparts.

In accordance with one prior art concept, the delay time of an acoustic surface-wave delay line, comprising a piezoelectric material such as $LiNbO_3$, is electronically controlled by shorting the piezoelectric field associated with the surface waves. In this manner, the elastic stiffness and therefore the surface wave velocity are decreased. However, in using these techniques, the shorting must be meticulously accomplished by controlling the surface conductivity of a metallic film on the piezoelectric substrate or by applying a direct current electric field to thereby change the distance between the metallic film and the piezoelectric surface. Further, the total or net delay available by using this technique is relatively limited. In the present invention, however, an entirely different concept is used to control the time delay provided by an acoustic device, in that the surface-wave (or longitudinal-wave) velocity of the device is controlled by the use of a ferroelectric-ferroelastic crystal.

SUMMARY OF THE INVENTION

This invention utilizes the recognition that the acoustic velocity in ferroelastic and ferroelectric crystals is different for different domains of polarization. Accordingly, there is provided a variable-delay acoustic device, comprising a body of ferroelastic and ferroelectric material having at least one domain wall separating two domains of substantially opposite ferroelectric polarization. First means act in combination with the body for translating an acoustic signal across the domain wall from a first portion of the body, spaced a first given distance from the domain wall and located in a first of the two domains, to a second portion of the body spaced a second given distance from the domain all and located in the other of the two domains. The device includes second means for moving the domain wall between the first and second portions of the body to change the ratio of the first and second given distances.

BRIEF DESCRIPTION OF THE DRAWING

The advantages of this invention will become more readily appreciated as the same becomes better understood by reference to the following detailed description when taken in conjunction with the accompanying drawing wherein.

DETAILED DESCRIPTION

The simultaneous existence of ferroelectricity and ferroelasticity in gadolinium molybdate [$Gd_2(MoO_4)_3$] has been reported in Aizu et al.: J. Phys. Soc. Japan 27 (1969) 511; and, in other publications. The concept of ferroelasticity, as well as ferroelasticity-ferroelectricity, can be conveniently described with reference to this known type of ferroelastic-ferroelectric crystal.

By cooling crystals of $Gd_2(MoO_4)_3$ through a predetermined temperature, the crystal structure changes from tetragonal to orthorhombic. In this structure state, the *a*-axis (or *x*-axis) of the crystal is shortened while the *b*-axis (or *y*-axis) is elongated, resulting in spontaneous strain. When a compressional stress is applied along the *b*-axis, the crystal deforms linearly with the stress. As the stress is increased further and exceeds a certain valve, the coercive stress, the *b*-axis is suddenly compressed into the *a*-axis and *a*-axis is elongated to become the *b*-axis. When the stress returns to zero, the deformation remains and, therefore, the *a*- and *b*-axes remain interchange. However, when a tensile stress larger than the coercive stress is applied along the new *a*-axis direction, the original crystal state is recovered. Hence, the stress-strain curve exhibits hysteresis. It is because of the obvious analogy with the hysteresis curves for ferroelectric and ferromagnetic materials, that this elastic property is called ferroelasticity.

Crystals of $Gd_2(MoO_4)_3$ are also ferroelectric in the range of temperature where they exhibit ferroelasticity, and the electric polarization is parallel to the *c*-axis. When the direction of the polarization is reversed by applying an electric field, the *a*- and *b*-axes are also interchanged. Thus, a similar hysteresis is seen in the strain-electric field curve as is obscured in the well-known polarization-electric field curve; and, the stress-strain curve. Thus, it should now be appreciated that the ferroelasticity is strongly coupled or related with the ferroelectricity in this crystal. The change in the crystal "state" described above, whether by applied mechanical stress or an electric field, is accomplished by the appearance of a domain wall, which nucleates at the corner of the crystal, and a shift of the wall across the crystal.

Figures 1, 2:
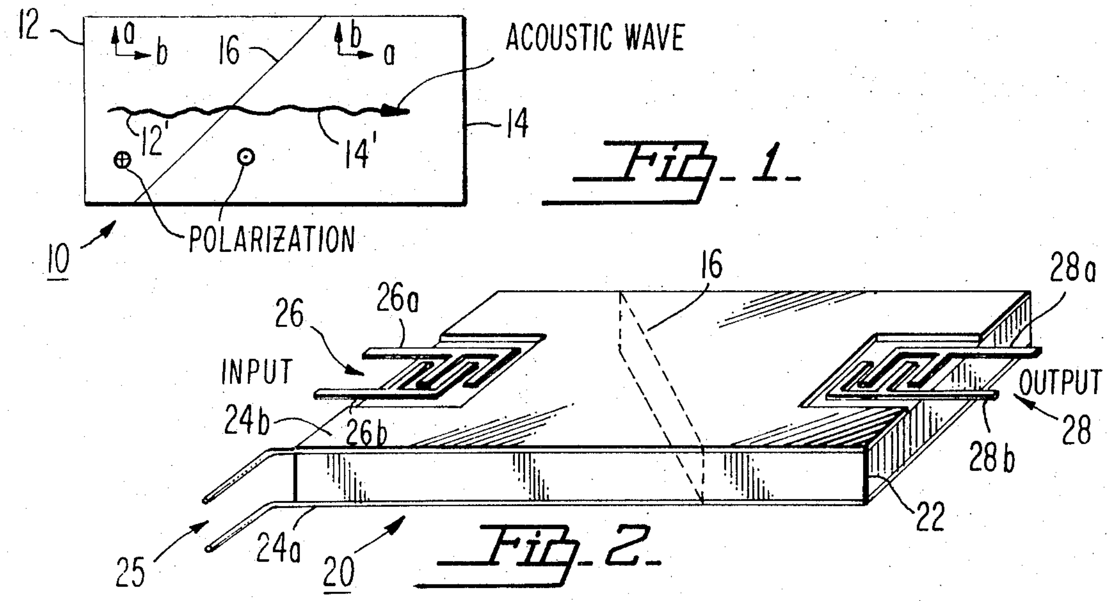
FIG. 1 is a schematic illustration of a single domain wall device arrangement which is useful in illustrating a principle of this invention.
FIG. 2 is an example of a surface-wave variable-delay device in accordance with the present invention.

Referring now to FIG. 1, there is shown a schematic illustration of a ferroelastic-ferroelectric delay device 10 in accordance with the present invention. Device 10 includes two domains with opposite directions of polarization. The domains are generally designated at 12 and 14 in FIG. 1. The domains are separated by a domain wall 16. The *c*-axis polarization is designated in each domain by a conventional arrow symbol. Since the *c*-axis of each domain is reversed with respect to the other domain, the *a*- and *b*-axes of each domain is accordingly interchanged with respect to the other domain. The respective *a*- and *b*-axes are also designated in the respective domains. An acoustic wave signal is designated as 12' in domain 12 and 14' in domain 14. It can be seen that the acoustic wave first propagates along the *b*-axis of domain 12 and then propagates along the *a*-axis of domain 14. Since the acoustic velocity is different for different crystal axis directions, the acoustic velocity in domain 12 is different from that in domain 14. And since domains 12 and 14 are separated by domain wall 16, the net delay time can be controlled by changing the position of domain wall 16 by applying an electric field normal to the plane of the *c*-axis (i.e., in the *c*-axis direction).

For purposes of the present invention, a domain wall may properly be assumed to initially exist within appropriately chosen materials such as, for example, isostructural molybdates. However, it is known that a domain wall can be established within materials of this general type by applying a field, which field exceeds the switching or coercive field of the material, to the material in order to nucleate a new domain wall. As is known in the art, a domain wall established in this manner, initially appears at a corner of the material. In any event, the domain wall is moved by applying a voltage to suitable electrodes in contact with the material so as to establish a field within the material and along its *c*-axis direction. The velocity of the domain wall under influence of the applied field is given by $V_d = \mu(E - E_{th})$ where $\mu$ is a constant related to the material, $E_{th}$ is the threshold field of the material, and $E$ is the applied field.

Referring now to FIG. 2, there is shown a surface-wave device in accordance with the principles of the present invention. Device 20 comprises a substrate 22 of suitable piezoelectric material. It has been found that $Gd_2(MoO_4)_3$ is not only a suitable ferroelastic-ferroelectric material but that it is also a suitable material for variable-delay surface-wave devices, in accordance with the teachings of the present invention, as it is also piezoelectric. Accordingly, $Gd_2(MoO_4)_3$ — or any other suitable ferroelastic-ferroelectric and piezoelectric material — may be used as the material for substrate 22. Device 20 includes electrodes **24*a* and 24*b* which are deposited, bonded or otherwise attached to opposite surfaces of substrate 22. Suitable leads which are shown generally at 25 may be coupled to the electrodes in order to facilitate application of an external voltage to device 20. Device 20 includes an input interdigital transducer 26. Transducer 26 comprises a first array of fingers 26*a* and a second array of fingers 26*b*. Transducer 26 may also be deposited, bonded or otherwise attached to substrate 22. Similarly, device 20 includes an output interdigital transducer 28 having finger arrays 28*a* and 28*b*.**

Domain wall 16 of device 20 separates two domains of opposite ferroelectric polarization. It can be seen that transducers 26 and 28 are each spaced a given distance from domain wall 16. In order to control the position of the domain wall, and therefore the ratio of the distances between the transducers and the domain wall, electrodes **24*a* and 24*b* are deposited on opposite surfaces of device 20. The extent of electrode 24*b* excludes the vicinity of the transducers so as to electrically separate electrode 24*b* from the transducers. In an actual embodiment transparent gold films were used as electrodes 24*a* and 24*b* in a device constructed in accordance with device 20 of FIG. 2.** For observation of the domain wall, a conventional polarizer and analyzer were used in conjunction with polarized light.

As is known in the art, an acoustic surface-wave can be generated within device 20 by coupling a suitable input signal, such as a radio frequency signal, to transducer 26. The generated acoustic wave is translated through device 20, across the domain wall 16, and is detected by transducer 28. In one constructed embodiment, the measured surface-wave velocity in the *c*-plane of $Gd_2(MoO_4)_3$ was $2.086 \times 10^5$ cm./sec. in the *a*-axis direction and $2.149 \times 10^5$ cm./sec. in the *b*-axis direction. Accordingly, the delay time provided by this construction was controllable up to 3 percent by varying the domain wall position with an electric field applied in the *c*-axis direction.

Figure 3:
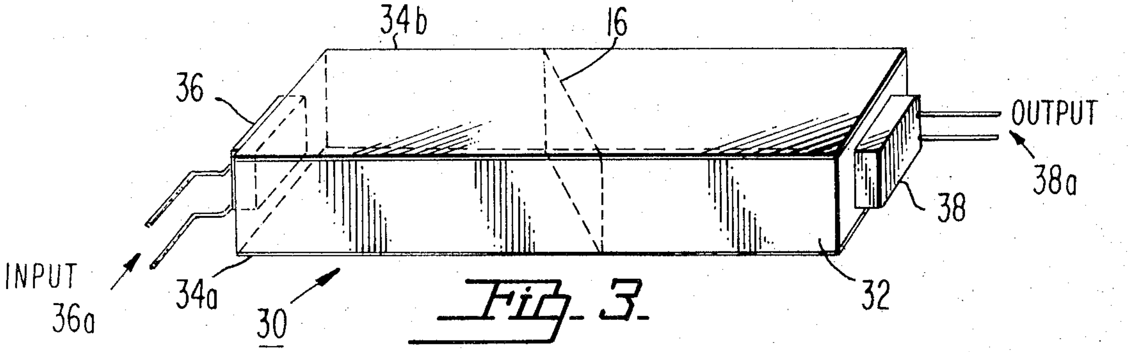
FIG. 3 is an exemplary embodiment of a bulk longitudinal-wave variable-delay device embodying the present invention.

FIG. 3 shows a bulk longitudinal-wave device constructed in accordance with the present invention. Device 30 of FIG. 3 includes a substrate 32 having electrodes **34*a* and 34*b* coupled to opposite surfaces of the substrate. The selected surfaces are perpendicular to the plane of domain wall 16. Accordingly, domain wall 16 can be moved along the length of substrate 32 by applying an external potential to electrodes 34*a* and 34*b*** which, in turn establishes an electric field along the *c*-axis of device 30. Device 30 includes an input transducer 36 and an output transducer 38. The transducers, with regard to this embodiment, may comprise suitable piezoelectric crystal materials or any other suitable means for generating and detecting longitudinal acoustic waves. The transducers may be bonded or otherwise attached to opposite ends of substrate 32 in the usual manner. It will be appreciated that by applying a suitable signal to leads **36*a* of transducer 36, a bulk longitudinal-wave is generated within substrate 32. The generated signal propagates through device 30 and is detected by transducer 38. An output signal can be taken from leads 38*a* of transducer 38.**

In another constructed embodiment of the present invention, in accordance with FIG. 3 of the drawing, the longitudinal-wave velocity in $Gd_2(MoO_4)_3$ was $3.48 \times 10^5$ cm./sec. in the *a*-axis direction and $3.90 \times 10^5$ cm./sec. in the *b*-axis direction. Accordingly, in accordance with the present invention, the delay time of the device constructed in accordance with device 30 of FIG. 3 was controlled up to 12 percent by controlling the domain wall position with an electric field applied in the *c*-axis direction.

Figure 4:
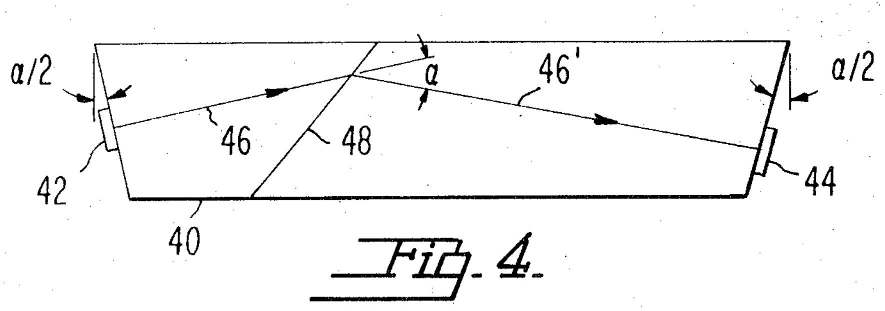
FIGS. 4 and 5 are combined schematic and geometrical representations illustrating preferred methods for coupling transducers to the device which embody the present invention.
Figure 5:
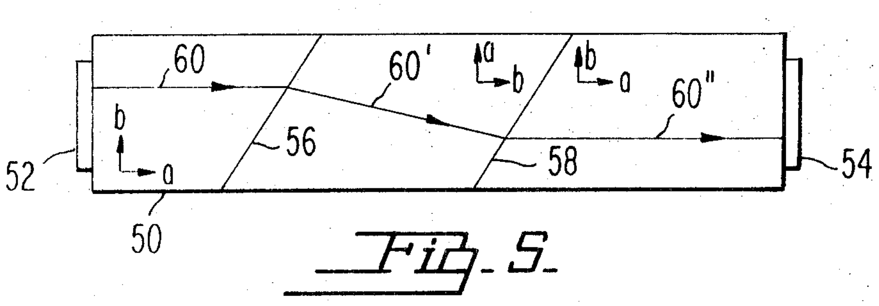

Referring now to FIGS. 4 and 5, there are shown preferred methods for coupling transducers to the various devices of the present invention. It should be noted that the techniques described below are applicable to devices using any type of acoustic wave mode. Accordingly, the transducers discussed below with reference to FIGS. 4 and 5, may take the form of interdigital transducers of the type described with reference to FIG. 2, when surface acoustic waves are utilized; and, may take the form of piezoelectric crystal materials of the type described with reference to FIG. 3, when longitudinal acoustic waves are utilized.

In FIG. 4 device 40 includes an input transducer 42 and an output transducer 44. An acoustic signal 46 is generated by transducer 42 and is propagated toward a domain wall 48. The acoustic signal 46 will be refracted at domain wall 48 due to the difference in velocity of the acoustic signal in the two domains, and is accordingly represented by signal 46'. The angle of refraction is represented by signal 46'. The angle of refraction is represented by $\alpha$ in FIG. 4. In order to ensure normal incidence of signal 46' at transducer 44, and therefore maximum coupling, device 40 is provided with "tilted" transducer mounting surfaces. For example, by mounting transducer 42 on a portion of device 40 having a tilted surface geometry represented by $\alpha/2$ with respect to the normally normal end surface, and by similarly mounting transducer 44 at an angle of $\alpha/2$, maximum coupling can be provided. It can be seen that by mounting the transducers in this manner, each transducer has a dimension respectively parallel to the wave-fronts of the generated and detected acoustic signal. It should be noted that angle $\alpha$ in FIG. 4 has been exaggerated fro the purpose of drawing clarity. Accordingly, it should be appreciated that the refractive angles normally encountered are significantly smaller than might be suggested by the drawing.

With reference to FIG. 5, there is shown a variable-delay acoustic device 50 having input and output transducers respectively designated as 52 and 54. Device 50 is provided with two domain walls individually designated as 56 and 58 in FIG. 5. A second domain wall may be provided in suitable materials of the present invention by applying an electric field which exceeds the switching or coercive field of the material in order to nucleate the second domain wall within the material. An acoustic signal 60 is generated by transducer 52 and propagates toward domain wall 56. A domain wall 56, signal 60 is refracted to become signal 60'. Similarly, acoustic signal 60' is propagated toward and refracted at domain wall 58. The twice-refracted acoustic signal is represented by 60''. Acoustic signal 60'' is propagated toward and detected by transducer 54. Thus it can be seen that by providing two distinct domain walls within device 50, each transducer exhibits a dimension respectively parallel to the wave fronts of the generated and detected acoustic signals. It can also be seen that the embodiment represented by FIG. 5 achieves maximum coupling without necessitating a tilted geometry.

It should now be apparent that any acoustic device constructed in accordance with the present invention can utilize more than one domain wall. That is, for surface wave devices, the multiple domain structure shown in FIG. 5 is also particularly desirable. For example, the efficiency of generation and detection of surface waves by an interdigital transducer is approximately twice as great for *a*-axis propagation as compared to *b*-axis propagation. Accordingly, in a surface wave device constructed in accordance with the present invention, and as exemplified in FIG. 5, each interdigital transducer can operate in a region of high-efficiency, *a*-axis propagation. In this case, the domain walls, represented as 56 and 58 in FIG. 5, would move in opposite directions when an electric-field is applied along the *c*-axis of the device. Thus, the width of the center domain, situated between domain walls 56 and 58, can be controlled to control the time delay of the device thereby.

It should be noted that multiple domain walls may be moved by utilizing the same means described with reference to the previous figures. Additionally, one or more of the plurality of domain walls can be effectively fixed with respect to the remaining walls by providing, for example, a deliberate defect in the crystal at the desired stationary-wall position.

While $Gd_2(MoO_4)_3$ has been described as a suitable candidate for a ferroelastic-ferroelectric material in accordance with the present invention, other materials exhibit the essential characteristics. For example, isostructural molybdates — where Gd in $Gd_2(MoO_4)_3$ is replaced by Sn, Eu, Tb or Dy — show a similar crystal structural change (phase transition) at their Curie temperatures. Accordingly, a voltage-controlled time delay effect is therefore expected. Further, materials other than the molybdates are strong candidates for a time delay device in accordance with the present invention. In this regard, Rochelle salt and $Fe_3B_7O_{13}Cl$ are notable as their Curie temperatures are above room temperature.

What has been taught then is a variable-delay acoustic wave device utilizing ferroelastic-ferroelectric materials and facilitating, notably, controlled time or phase delay or radio frequency signals.

What is claimed is:

1. A variable-delay acoustic device, comprising:

a body of ferroelastic and ferroelectric material having at least one domain wall separating two domains of substantially opposite ferroelectric polarization;

first means in combination with said body for translating an acoustic signal across said domain wall from a first portion of said body spaced a first given distance from said domain wall and located in a first of said two domains to a second portion of said body spaced a second given distance from said domain wall and located in the other of said two domains; and second means for moving said domain wall between said first and second portions of said body to change the ratio of said first and second given distances.

2. A variable-delay acoustic device, comprising:

a body of ferroelastic and ferroelectric material having at least one domain wall separating two domains of substantially opposite ferroelectric polarization;

first means in combination with said body for translating an acoustic signal across said domain wall from a first portion of said body spaced a first given distance from said domain wall and located in a first of said two domains to a second portion of said body spaced a second given distance from said domain wall and located in the other of said two domains; and second means for moving said domain wall between said first and second portions of said body to change the ratio of said first and second given distances, said second means having first and second electrodes respectively coupled to first and second opposite surfaces of said body and wherein each of said opposite surfaces is substantially perpendicular to the plane of said domain wall, whereby said domain wall is moved in response to an electric field established in said body between said electrodes.

3. The device according to claim 2, wherein said body is also piezoelectric and wherein said first means comprises first and second transducers coupled respectively to selective surface regions of said first and second portions for translating surface-wave acoustic signals between said first and second transducers.

4. The device according to claim 1, wherein said first means comprises first and second transducers coupled respectively to said first and second portions for translating bulk longitudinal wave acoustic signals through said body.

5. The device according to claim 1, wherein said material is $Gd_2(MoO_4)_3$.

6. The device according to claim 1, wherein said second means comprises first and second thin film electrodes respectively bonded to opposite surfaces of said body, each of said surfaces being substantially perpendicular to the plane of said domain wall.

7. The device according to claim 2, wherein said first means comprises first and second transducers coupled respectively to said first and second portion of said body to respectively generate and detect said acoustic signal, each transducer having a dimension respectively arranged in parallel with the wave fronts of the generated and detected acoustic signal.

8. The device according to claim 7, wherein said first and second means respectively comprise input and output interdigital transducers respectively coupled to said first and second portions of said body and respectively adapted to generate and detect surface-wave acoustic signals which are translated through said body.

9. A variable-delay acoustic device, comprising:

a body of ferroelastic and ferroelectric material, said body having at least two domains of substantially opposite ferroelectric polarization defining a domain wall;

first means for coupling an input signal to a first portion of said body;

second means for coupling an output signal from said body at a second portion thereof; and means for moving said domain wall between said first and second portions of said body wherein the total propagation delay of an acoustic signal translated through said body between said first and second portions thereof is controlled by moving said domain wall.

10. The device according to claim 9, wherein said first means comprises an input transducer and said second means comprises an output transducer, said input and output transducers each have a side in a plane respectively parallel to the wave fronts of the generated and detected acoustic signals.

11. The device according to claim 7, wherein said first and second means respectively comprise input and output transducers respectively couple to said first and second portions of said body and respectively adapted to generate and detect bulk-longitudinal wave acoustic signals which are translated through and within said body.

12. The device according to claim 10, wherein said input and output transducers each have a dimension respectively parallel to the wave fronts of the generated and detected acoustic signals, thereby to increase the relative coupling between said acoustic signals and said transducers.

13. The device according to claim 7, wherein said means for moving said domain wall includes; first and second electrodes respectively coupled to first and second opposite surfaces of said body, each of said surfaces being substantially perpendicular to the plane of said domain wall; and means for establishing an electric field between said first and second electrodes to vary the position of said domain wall.

14. The device according to claim 7, wherein said material is $Gd_2\ (MoO_4)_3$.

* * * * *

UNITED STATES PATENT OFFICE

CERTIFICATE OF CORRECTION

Patent No. 3,840,826 Dated October 8, 1974

Inventor(s) Minoru Toda and Soitiro Tosima

It is certified that error appears in the above-identified patent and that said Letters Patent are hereby corrected as shown below:

Column 1, line 50 "all" should be --wall--; Column 5, line 10 "fro" should be --for--; Column 5, line 24 "A" should be --At--; Column 8, Claim 11, line 3 "couple" should be --coupled--.

Signed and sealed this 14th day of January 1975.

(SEAL)
Attest:

McCOY M. GIBSON JR.
Attesting Officer

C. MARSHALL DANN
Commissioner of Patents